United States Patent
Andreev et al.

(10) Patent No.: US 7,216,278 B2
(45) Date of Patent: May 8, 2007

(54) METHOD AND BIST ARCHITECTURE FOR FAST MEMORY TESTING IN PLATFORM-BASED INTEGRATED CIRCUIT

(75) Inventors: Alexander E. Andreev, San Jose, CA (US); Anatoli A. Bolotov, Cupertino, CA (US); Ranko Scepanovic, Saratoga, CA (US)

(73) Assignee: LSI Logic Corporation, Milpitas, CA (US)

(*) Notice: Subject to any disclaimer, the term of this patent is extended or adjusted under 35 U.S.C. 154(b) by 211 days.

(21) Appl. No.: 10/999,493

(22) Filed: Nov. 30, 2004

(65) Prior Publication Data
US 2006/0156088 A1 Jul. 13, 2006

(51) Int. Cl.
*G01R 31/28* (2006.01)
(52) U.S. Cl. .................. 714/733; 714/718; 714/736
(58) Field of Classification Search ............. None
See application file for complete search history.

(56) References Cited

U.S. PATENT DOCUMENTS

| | | | | |
|---|---|---|---|---|
| 5,173,906 A | * | 12/1992 | Dreibelbis et al. | 714/733 |
| 5,995,731 A | * | 11/1999 | Crouch et al. | 716/4 |
| 6,321,320 B1 | * | 11/2001 | Fleischman et al. | 711/217 |
| 2002/0059543 A1 | * | 5/2002 | Cheng et al. | 714/30 |
| 2004/0128596 A1 | * | 7/2004 | Menon et al. | 714/724 |
| 2005/0066247 A1 | * | 3/2005 | Cheng et al. | 714/733 |

* cited by examiner

*Primary Examiner*—Guy Lamarre
*Assistant Examiner*—John P. Trimmings
(74) *Attorney, Agent, or Firm*—Suiter Swantz PC LLO

(57) ABSTRACT

The present invention provides a method and BIST architecture for fast memory testing in a platform-based integrated circuit. The method may include steps as follows. An Mem-BIST controller transmitter is started to generate input signals for a memory in a platform using a deterministic and unconditional test algorithm. The input signals are delayed by a first group of pipelines by n clock cycles. The delayed input signals are received by the memory and an output signal is generated by the memory. The output signal is delayed by a second pipeline by m clock cycles. An Mem-BIST controller receiver is started to receive the delayed output signal for comparison.

19 Claims, 5 Drawing Sheets

METHOD AND BIST ARCHITECTURE FOR FAST MEMORY TESTING IN PLATFORM-BASED INTEGRATED CIRCUIT

FIELD OF THE INVENTION

The present invention generally relates to the field of integrated circuits, particularly to a method and Built-In Self Test (BIST) architecture for fast memory testing in a platform-based integrated circuit.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

At the stage of synthesis for VLSI (Very Large-Scale Integration) designs, it is well known that memories typically have a much higher defect density than other logic. As a result, memories require comprehensive testing. One conventional method for memory testing is to use a Memory Built-In Self Test (Mem-BIST) controller, which is placed on a chip close to the memory under test, to perform testing in the test mode (see FIG. 3).

In platform-based design, there are often tens or even hundreds of memories on a chip. The conventional method of placing one Mem-BIST controller for each memory instance may result in an unwanted increase in the chip area. On the other hand, a platform (e.g., RapidChip™) often includes multiple instances of a single memory type or module. Thus, it is desired to share one Mem-BIST controller for all instances of each memory type. However, connecting a Mem-BIST controller to multiple instances of a single memory type directly may lead to long propagation delays along with long wires, thereby decreasing the test frequency (see FIG. 5).

Thus, it is desirable to provide a new method and BIST architecture for fast memory testing in a platform-based integrated circuit, which may increase test frequency of multiple instances of a single memory type.

SUMMARY OF THE INVENTION

In an exemplary aspect, the present invention provides a method of fast memory testing in a platform-based integrated circuit. The method may include steps as follows. An Mem-BIST controller transmitter is started to generate input signals for a memory in a platform using a deterministic and unconditional test algorithm. The input signals are delayed by a first group of pipelines by n clock cycles. The delayed input signals are received by the memory and an output signal is generated by the memory. The output signal is delayed by a second pipeline by m clock cycles. An Mem-BIST controller receiver is started to receive the delayed output signal for comparison.

In an additional exemplary aspect, the present invention provides an BIST architecture for fast memory testing in a platform-based integrated circuit. The BIST architecture includes a memory of a platform and a Mem-BIST controller transmitter. The Mem-BIST controller transmitter is communicatively coupled to the memory via pipelines P_n for generating input signals for the memory, using a deterministic and unconditional test algorithm. The pipelines P_n delay the input signals by n clock cycles. The BIST architecture also includes a Mem-BISTt controller receiver, which is communicatively coupled to the memory via a pipeline P_m, for receiving an output signal from the memory for comparison. The pipeline P_m delays the output signal by m clock cycles. The BIST architecture further includes a Mem-BIST driver, which is communicatively coupled to the Mem-BIST controller transmitter and the Mem-BIST controller receiver, for managing operations of the Mem-BIST controller transmitter and the Mem-BIST controller receiver.

In another exemplary aspect, the present invention provides an BIST architecture for fast memory testing in a platform-based integrated circuit. The BIST architecture includes a plurality of memory instances of a memory type in a platform and a Mem-BIST controller transmitter for generating input signals for the plurality of memory instances using a deterministic and unconditional test algorithm. The Mem-BIST controller transmitter is communicatively coupled to the plurality of memory instances via a first group of signal switching means. The first group of signal switching means delay the input signals. The BIST architecture also includes a Mem-BIST controller receiver for receiving output signals from the plurality of memory instances for comparison. The Mem-BIST controller receiver is communicatively coupled to the plurality of memory instances via a second group of signal switching means, which delay the output signals. The BIST architecture further includes a Mem-BIST driver, which is communicatively coupled to the Mem-BIST controller transmitter and the Mem-BIST controller receiver, for managing operations of the Mem-BIST controller transmitter and the Mem-BIST controller receiver.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention provides an architecture and method for speeding up memory Built-In Self Testing (BIST) technique that employs a deterministic algorithm for memory testing. The present invention provides a new architecture for at-speed memory testing using existing Memory Built-In Self Testing (Mem-BIST) controllers for testing multiple instances of the same memory type in a chip. The present invention creates a method for memory testing via pipelines, which may permit testing multiple memory instances placed separately from the Mem-BIST controller on a chip, which is essential for platform-based IC designs.

Figure 4:
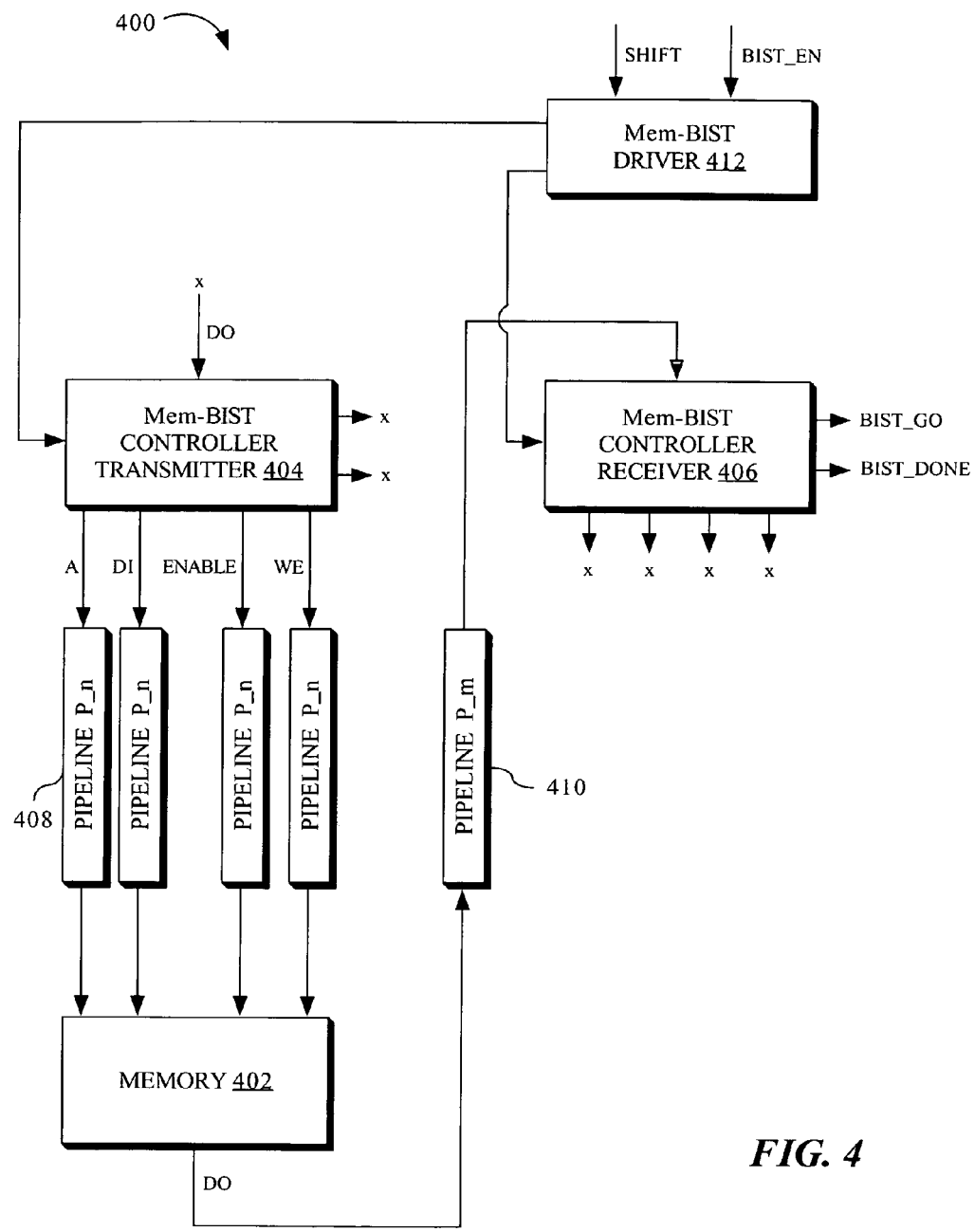
FIG. 4 is a schematic diagram illustrating an BIST architecture for fast memory testing in a platform-based integrated circuit in accordance with an exemplary embodiment of the present invention.

The present invention uses two identical Mem-BIST controllers: one used as a transmitter of memory input patterns while the other as a receiver of memory output signals (see FIG. 4). These two controllers are synchronized in that the receiver starts to work after a delay from the time the transmitter starts to work, which is exactly equal to the delay caused by pipelines.

It is understood that the present invention not only applies in memory testing but also in other testers of a different nature when the underlying test algorithm is deterministic and unconditional.

A. Memory and Mem-BIST Controller

Figure 1:
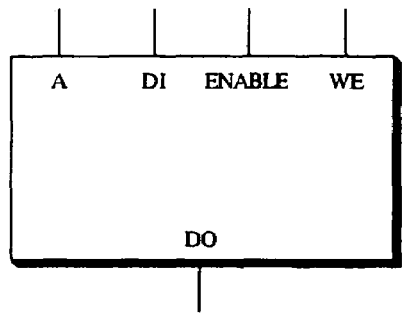
FIG. 1 is a schematic diagram illustrating a memory.

A memory (or memory module) (see FIG. 1) is a standard module of a memory type, which is widely used in various chip designs for data storing along with the data-read and data-write operations. In general, at each clock cycle, the memory module can be in an active (enabled) or inactive (disabled) state depending on the ENABLE input signal. When enabled (ENABLE=1) and when the write-enable input signal is also High (WE=1), data presented at the module's data-input port (DI) is written into the memory location specified by an address presented at the input address port (A). When enabled (ENABLE=1) and when the write-enable signal is Low (WE=0), data stored at the memory location specified by the input address A is output through the module's data-output port (DO).

Due to their dense layout, memories usually have a much higher defect density than other logic and thus require comprehensive testing. Generally, the conventional testing solution is by a Memory Built-In Self Test (Mem-BIST) controller, which is placed on a chip close to the memory and performs testing in the test mode (see FIG. 3).

Figure 2:
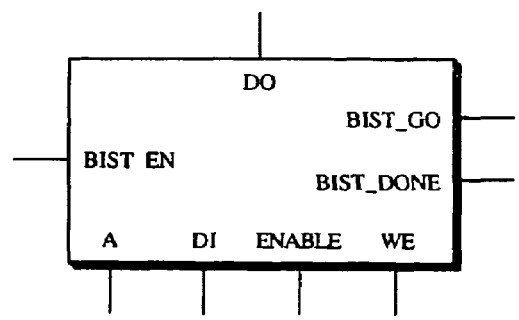
FIG. 2 is a schematic diagram illustrating a memory BIST controller (Mem-BIST controller)

An Mem-BIST controller (see FIG. 2) has a dual interface corresponding to memory input and output ports and performs a sequence of test read and write operations according to the implemented test algorithm, which may be a data path test, a retention data test, a bit read and write test, an address decoder test, or the like.

Figure 3:
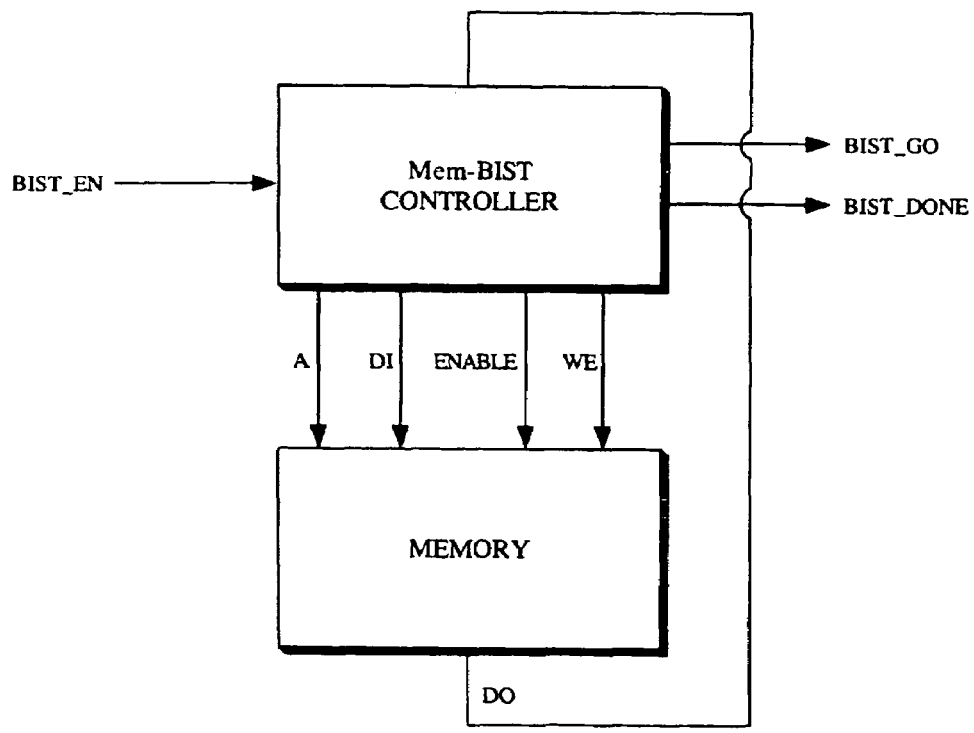
FIG. 3 is a schematic diagram illustrating a conventional test structure including a Mem-BIST controller and a memory under test.

Like a memory, the Mem-BIST controller may be in an active (enabled) or inactive (disabled) state depending on the BIST_EN input signal. As shown in FIG. 3, when enabled (BIST_EN=1), the controller sends to the memory module under test a testing sequence of data write and data read requests. That is, at each clock cycle the controller forms the ENABLE, WE, A, DI signals and send them through its output ports ENABLE, WE, A, and DI to the corresponding memory ports to perform the read or write operation in the memory module.

In each case of read operation sent to the memory, data presented at the controller's input port (DO) at the next clock cycle (i.e., the result of read operation from the memory) is compared in the controller with the expected value. If a comparison error occurs, then controller's output signal BIST_GO becomes High (BIST_GO=1), which indicates an error; otherwise, it stays Low (BIST_GO=0). Knowing the address at which BIST_GO goes High and what memory input data and address causes the comparison error allows construction of a memory error bitmap or an address error map, which is useful for diagnostic or debugging purposes.

At the end of a testing sequence, the "done" signal is output through the controllers' data-output port BIST-DONE. The BIST-DONE output signal stays Low throughout the test and goes High at the end of test.

Note that in what follows, it is assumed that the testing algorithm generating the test sequence of read and write memory operations is deterministic and unconditional (i.e., the algorithm generates the test sequence independent of what the controller receives from the memory module throughout the test). Note that this is also the case for the generally available test algorithms and Mem-BIST controllers.

B. New Mem-BIST Architecture

FIG. 4 is a schematic diagram illustrating an BIST architecture 400 for fast memory testing in a platform-based integrated circuit in accordance with an exemplary embodiment of the present invention. As shown, the BIST architecture 400 allows pipelined signals between the memory module 402 and Mem-Bist controllers 404 and 406, thereby speeding up the testing frequency. According to the present invention, the Mem-BIST controllers 404 and 406 need not be placed close to the memory 402 on a chip. The present BIST architecture 400 may preferably use two identical Mem-BIST controllers 404 and 406. The first one (the Mem-BIST controller transmitter 404) is used for generating—in a usual way as it normally does—inputs for the memory module 402 such as ENABLE signal, WE signal, address A signal, and input data DI signal, while the second one (the Mem-BIST controller receiver 406) is used only for DO signal comparison as it also normally does in the "one controller" configuration.

Still referring to FIG. 4, input signals from the transmitter 404 to the memory module 402 and output signals from the memory module 402 to the receiver 406 go through pipelines P-n 408 and P-m 410, which delay the signals for n and m clock cycles respectively. A pipeline is a chain of consecutively connected flip-flops. Note that all memory inputs have the same delay, which is equal to n clock cycles. Thus, the signal from the transmitter 404 arrives at the receiver 406 via the memory module 402 with the delay of (n+m) clock cycles. The receiver 406 knows nothing about this extra (n+m) clock cycles delay. However, if one postpones the start of the receiver 406 by exactly (n+m) clock cycles, then the receiver 406 receives output data from the memory module 402 as the receiver 406 would receive the output data with no pipelines. Thus, if the receiver 406 is started exactly (n+m) clock cycles after the transmitter 404 is started, then input and output flows of the receiver 406 may be synchronized, just like what would have received in the case of only one Mem-BIST controller connected to the memory module with no pipeline (e.g., the conventional test configuration, see FIG. 3). In other words, the BIST_GO and BIST_DONE signals of the receiver 406 may correctly reflect the test progress (i.e. the same way as they normally do).

The BIST architecture 400 includes a Mem-BIST driver module 412 for managing operations of the Mem-BIST controller transmitter 404 and the Mem-BIST controller receiver 406. The Mem-BIST driver module 412 includes an auxiliary input SHIFT for indicating a possible delay or shift in staring time for the two Mem-BIST controllers 406 and 406. After receiving the input signal BIST_EN High, the Mem-BIST driver module 412 first sends the BIST_EN signal High to the transmitter controller 404 and then, after a delay of (n+m) clock cycles, sends the BIST_EN signal High to the to the receiver controller 406, thus activating the entire test. It is understood that in FIG. 4 wires starting or ending with an "x" mark indicate dummy wires with don't-care values.

Figure 5:
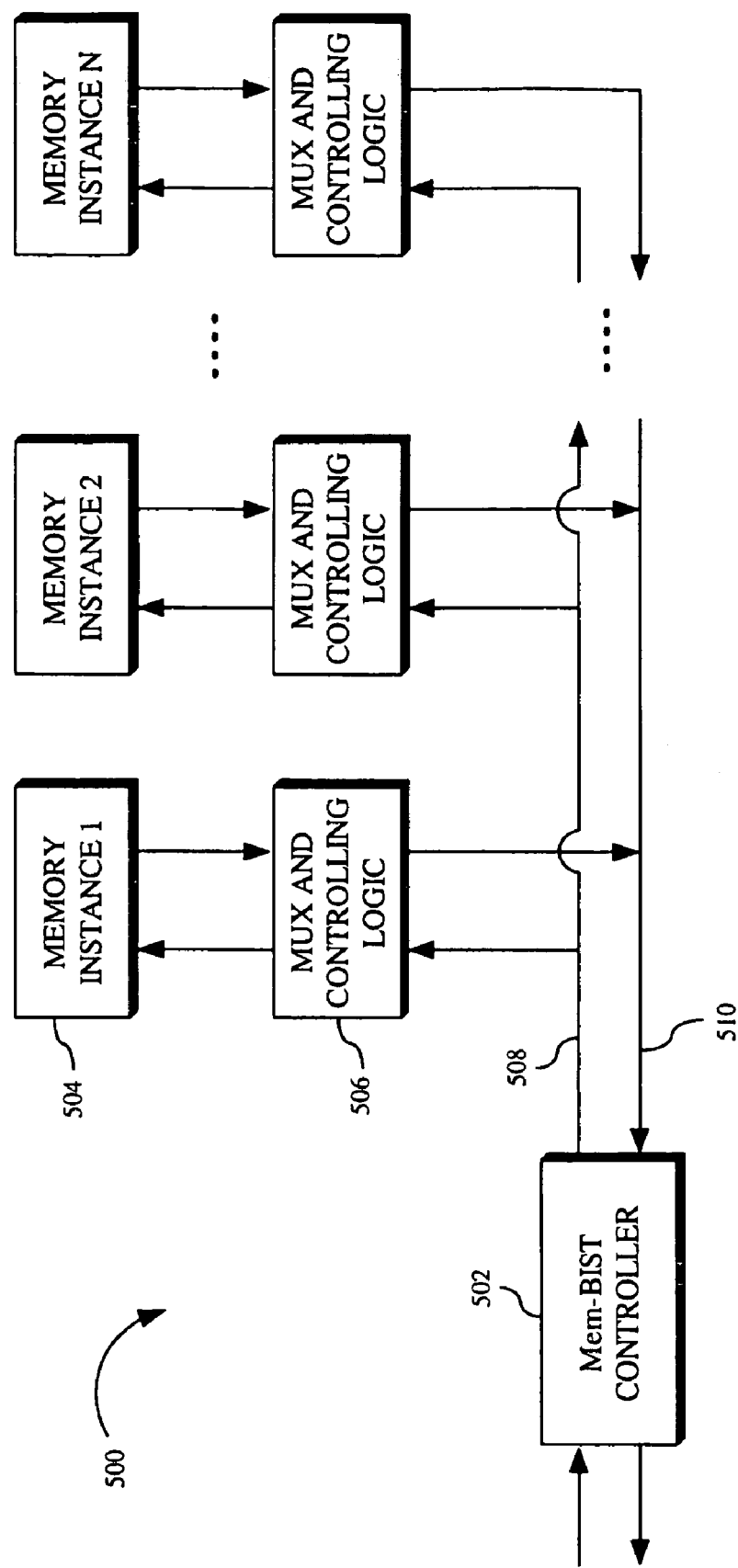
FIG. 5 is a schematic diagram illustrating a conventional test structure including a Mem-BIST controller and a plurality of memory instances of a memory type under test.

FIG. 5 is a schematic diagram illustrating a conventional test structure 500 including a Mem-BIST controller 502 and a plurality of memory instances 504 of a memory type under test. The Mem-BIST controller 502 is communicatively coupled to the plurality of memory instances 504 via a group of Mux and Controlling Logic 506 for setting one of the memory instances 504 for testing and also for selecting between test input memory bus 508 and test output memory bus 510 from one side and memory input and output buses from the other side. Such a test structure 500 may lead to long propagation delays along with long wires, thereby decreasing the test frequency.

Figure 6:
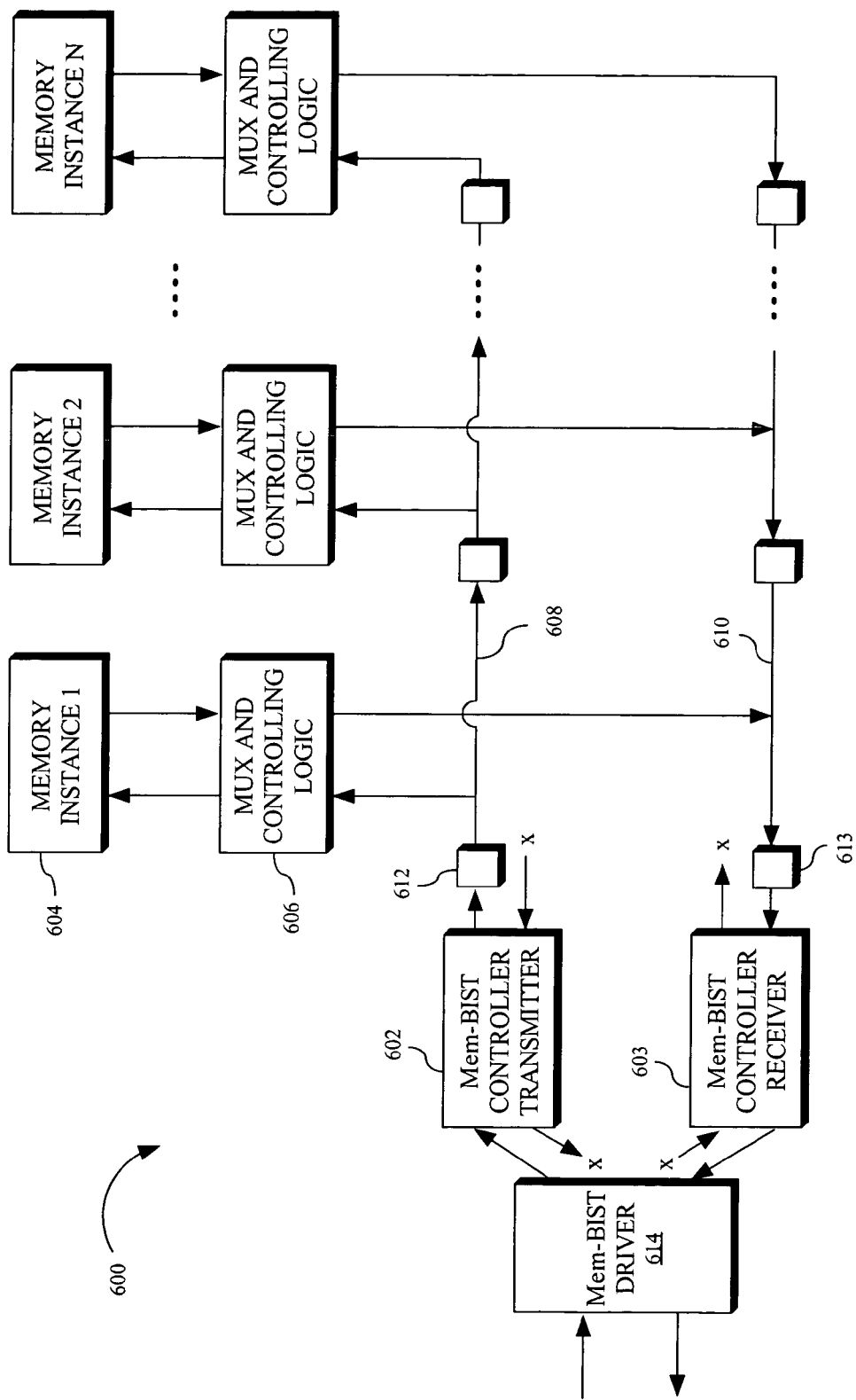
FIG. 6 is a schematic diagram illustrating an BIST architecture for fast memory testing in a platform-based integrated circuit in accordance with an exemplary embodiment of the present invention, wherein the BIST architecture includes a Mem-BIST controller transmitter, a Mem-BIST controller receiver, and a plurality of memory instances of a memory type under test.

FIG. 6 is a schematic diagram illustrating an BIST architecture 600 for fast memory testing in a platform-based integrated circuit in accordance with an exemplary embodiment of the present invention. The BIST architecture 600 includes a plurality of memory instances 604 of a memory type in a platform, and a Mem-BIST controller transmitter 602 for generating input signals for the plurality of memory instances 604 using a deterministic and unconditional test algorithm. The Mem-BIST controller transmitter 602 is communicatively coupled to the plurality of memory instances 604 via a first group of signal switching means 612 (e.g., flip-flops, or the like). The first group of signal switching means 612 delay the input signals. The BIST architecture 600 also includes a Mem-BIST controller receiver 603 for receiving output signals from the plurality of memory instances 604 for comparison. The Mem-BIST controller receiver 603 is communicatively coupled to the plurality of memory instances 604 via a second group of signal switching means 613 (e.g., flip-flops, or the like), which delay the output signals. The BIST architecture 600 further includes a Mem-BIST driver 614, which is communicatively coupled to the Mem-BIST controller transmitter 602 and the Mem-BIST controller receiver 603, for managing operations of the Mem-BIST controller transmitter 602 and the Mem-BIST controller receiver 603. Preferably, the Mem-BIST controller transmitter 602 and the Mem-BIST controller receiver are identical (i.e., have the same internal structure). The BIST architecture 600 may further include a group of Mux and Controlling Logic 606 for setting one of the memory instances 604 for testing and also for selecting between test input memory bus 608 and test output memory bus 610 from one side and memory input and output buses from the other side. The group of Mux and Controlling Logic 606 may be communicatively coupled to the plurality of memory instances 604, the first group of signal switching means 612 and the second signal switching means 613. It is understood that in FIG. 6 wires starting or ending with an "x" mark indicate dummy wires with don't-care values. It is understood that the actual delay in clock cycles (i.e., shift in staring time for the transmitter 602 and the receiver 603) depends on the particular memory instance 604 selected or set for testing (e.g., for a memory instance K, the shift may be equal to 2K). In the BIST architecture 600, all memory instances 604 are tested step by step in a row or in some other order. However, each time preferably only one memory instance 604 is tested.

Figure 7:
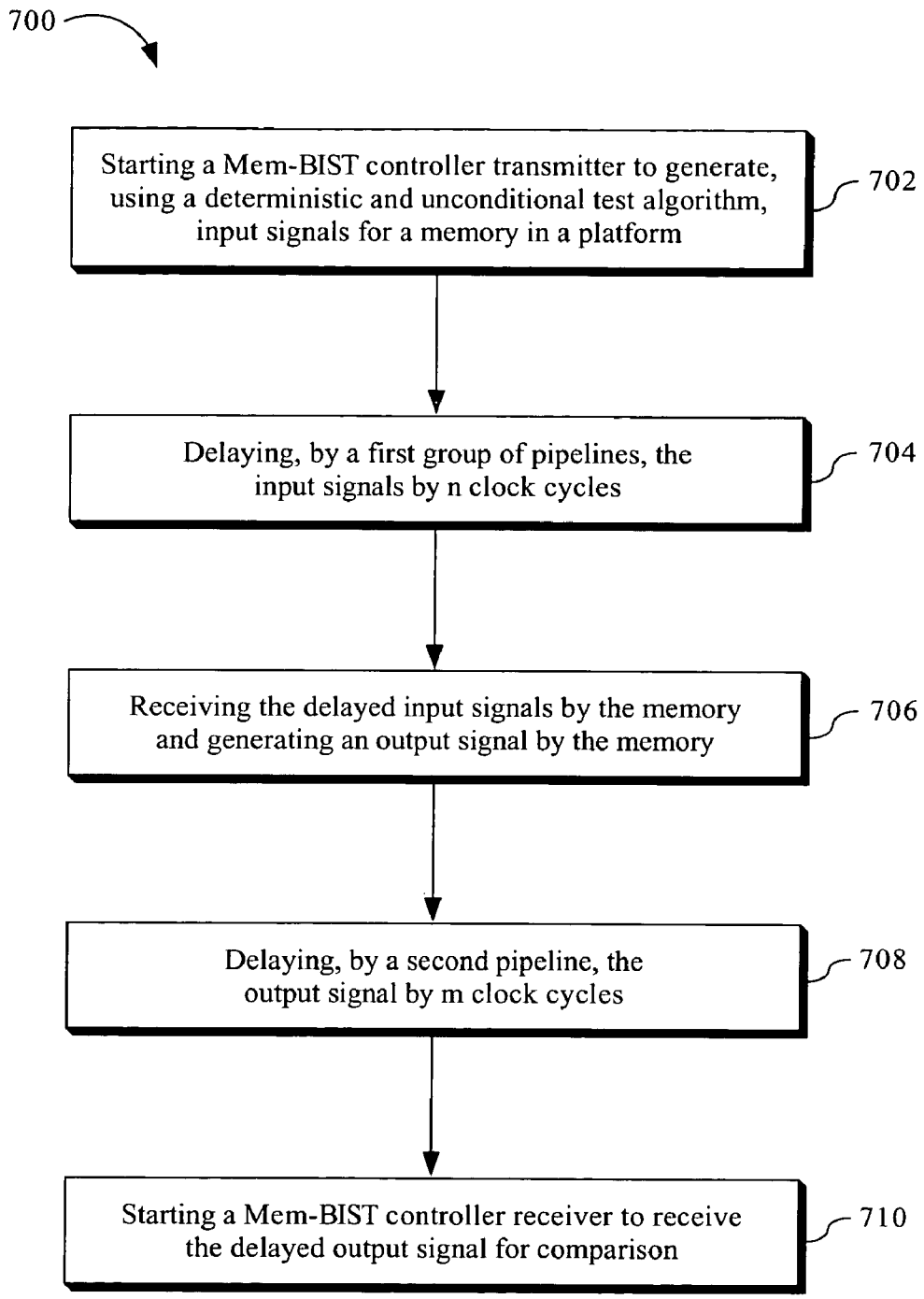
FIG. 7 is a flow diagram of a method of fast memory testing in a platform-based integrated circuit in accordance with an exemplary embodiment of the present invention.

FIG. 7 is a flow diagram of a method 700 of fast memory testing in a platform-based integrated circuit in accordance with an exemplary embodiment of the present invention. The method 700 may be implemented in the BIST architecture 400 shown in FIG. 4 and the BIST architecture 600 shown in FIG. 6. The method 700 may include steps as follows. An Mem-BIST controller transmitter is started to generate input signals for a memory in a platform using a deterministic and unconditional test algorithm 702. The input signals are delayed by a first group of pipelines by n clock cycles 704. The delayed input signals are received by the memory and an output signal is generated by the memory 706. The output signal is delayed by a second pipeline by m clock cycles 708. An Mem-BIST controller receiver is started to receive the delayed output signal for comparison 710.

The present invention may provide the following advantages. First, the present BIST architecture may increase test frequency and speed up memory testing. In addition, the present invention may improve timing and reduce the die size. Moreover, the present BIST architecture may test memories remotely located on a chip. Further, the present architecture is easy to implement. Additionally, the present invention may test multiple instances of the same memory type with a single controller.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of fast memory testing in a platform-based integrated circuit, comprising steps of:
    starting a Mem-BIST controller transmitter to generate, using a deterministic and unconditional test algorithm, input signals for a memory in a platform;
    delaying, by a first group of pipelines, said input signals by n clock cycles;
    receiving said delayed input signals by said memory and generating an output signal by said memory;
    delaying, by a second pipeline, said output signal by m clock cycles; and
    starting a Mem-BIST controller receiver to receive said delayed output signal for comparison, wherein said Mem-BIST controller receiver is started n+m clock cycles after said Mem-BIST controller transmitter is started.

2. The method of claim 1, wherein said memory is an instance of a memory type in said platform.

3. The method of claim 1, wherein said Mem-BIST controller transmitter and said Mem-BIST controller receiver are identical.

4. The method of claim 1, wherein said input signals are A, DI, ENABLE, and WE signals representing a test sequence of read and write operations.

5. The method of claim 1, wherein said output signal is a DO signal from said memory.

6. The method of claim 1, wherein said starting a Mem-BIST controller transmitter step comprising:
    receiving a BIST_EN High signal by a Mem-BIST driver; and
    sending said BIST_EN High signal to said Mem-BIST controller transmitter by said Mem-BIST driver to start said Mem-BIST controller transmitter.

7. The method of claim 1, wherein said starting a Mem-BIST controller receiver step comprising:
    receiving a BIST_EN High signal by a Mem-BIST driver; and n+m clock cycles after said Mem-BIST controller transmitter is started, sending said BIST_EN High signal to said Mem-BIST controller receiver by said Mem-BIST driver to start said Mem-BIST controller receiver.

8. An BIST architecture for fast memory testing in a platform-based integrated circuit, comprising:
    a memory in a platform;
    a Mem-BIST controller transmitter, communicatively coupled to said memory via pipelines P_n, for generating input signals for said memory using a deterministic and unconditional test algorithm, said pipelines P_n delaying said input signals by n clock cycles;
    a Mem-BIST controller receiver, communicatively coupled to said memory via a pipeline P_m for receiving an output signal from said memory for comparison, said pipeline P_m delaying said output signal by m clock cycles; and
    a Mem-BIST driver, communicatively coupled to said Mem-BIST controller transmitter and said Mem-BIST controller receiver, for managing operations of said Mem-BIST controller transmitter and said Mem-BIST controller receiver, wherein said Mem-BIST driver is suitable for starting said Mem-BIST controller receiver n+m clock cycles after starting said Mem-BIST controller transmitter.

9. The BIST architecture of claim 8, wherein said memory is an instance of a memory type in said platform.

10. The BIST architecture of claim 8, wherein said Mem-BIST controller transmitter and said Mem-BIST controller receiver are identical.

11. The BIST architecture of claim 8, wherein said input signals are A, DI, ENABLE, and WE signals representing a test sequence of read and write operations.

12. The BIST architecture of claim 8, wherein said output signal is a DO signal from said memory.

13. The BIST architecture of claim 8, wherein a DO port of said Mem-BIST controller transmitter, a BIST_GO port of said Mem-BIST controller transmitter, a BIST_DONE port of said Mem-BIST controller transmitter, an A port of said Mem-BIST controller receiver, a DI port of said Mem-BIST controller receiver, an ENABLE port of said Mem-BIST controller receiver, and a WE port of said Mem-BIST controller receiver are connected with dummy wires with don't-care values.

14. The BIST architecture of claim 8, wherein said Mem-BIST driver is suitable for starting said Mem-BIST controller transmitter.

15. The BIST architecture of claim 14, wherein after receiving a BIST_EN High signal, said Mem-BIST driver starts said Mem-BIST controller transmitter by sending said BIST_EN High signal to said Mem-BIST controller transmitter.

16. The BIST architecture of claim 8, wherein after receiving a BIST_EN High signal, said Mem-BIST driver starts said Mem-BIST controller transmitter by sending said BIST_EN High signal to said Mem-BIST controller transmitter, and starts said Mem-BIST controller receiver by sending said BIST_EN High signal to said Mem-BIST controller receiver n+m clock cycles after starting said Mem-BIST controller transmitter.

17. A BIST architecture for fast memory testing in a platform-based integrated circuit, comprising:
    a plurality of memory instances of a memory type in a platform;

a Mem-BIST controller transmitter, communicatively coupled to said plurality of memory instances via a first group of signal switching means, for generating input signals for said plurality of memory instances using a deterministic and unconditional test algorithm, said first group of signal switching means delaying said input signals;

a Mem-BIST controller receiver, communicatively coupled to said plurality of memory instances via a second group of signal switching means, for receiving output signals from said plurality of memory instances for comparison, said second group of signal switching means delaying said output signals; and a Mem-BIST driver, communicatively coupled to said Mem-BIST controller transmitter and said Mem-BIST controller receiver, for managing operations of said Mem-BIST controller transmitter and said Mem-BIST controller receiver, wherein said Mem-BIST controller transmitter and said Mem-BIST controller receiver are identical.

18. The BIST architecture of claim 17, wherein said first group of signal switching means include flip-flops.

19. The BIST architecture of claim 17, further comprises a group of Mux and Controlling Logic, communicatively coupled to said plurality of memory instances, said first group of signal switching means and said second signal switching means, for setting one of said plurality of memory instances for testing.

* * * * *